(12) United States Patent
Agrawal et al.

(10) Patent No.: US 10,594,309 B2
(45) Date of Patent: Mar. 17, 2020

(54) PHASE MODULATION SYSTEMS AND METHODS

(71) Applicant: Intel Corporation, Santa Clara, CA (US)

(72) Inventors: Abhishek Agrawal, Beaverton, OR (US); Stefano Pellerano, Beaverton, OR (US); Yanjie Wang, Hillsboro, OR (US); Peter Sagazio, Portland, OR (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/025,148

(22) Filed: Jul. 2, 2018

(65) Prior Publication Data
US 2020/0007116 A1    Jan. 2, 2020

(51) Int. Cl.
*H03K 7/06*    (2006.01)
*H04L 27/20*    (2006.01)

(52) U.S. Cl.
CPC .............. *H03K 7/06* (2013.01); *H04L 27/20* (2013.01)

(58) Field of Classification Search
None
See application file for complete search history.

(56) References Cited

U.S. PATENT DOCUMENTS

| | | | | |
|---|---|---|---|---|
| 6,166,990 | A * | 12/2000 | Ooishi | G11C 7/22 365/194 |
| 6,389,946 | B1 * | 5/2002 | Frid | A61F 2/856 87/11 |
| 6,436,039 | B1 * | 8/2002 | Lannutti | A61B 8/06 600/437 |
| 9,337,874 | B1 * | 5/2016 | Yu | H03M 1/0863 |
| 2005/0132158 | A1 * | 6/2005 | Hampel | G11C 7/10 711/167 |
| 2008/0169855 | A1 * | 7/2008 | Shin | H03K 5/1565 327/175 |
| 2010/0054350 | A1 * | 3/2010 | Kojima | H03K 7/08 375/260 |
| 2014/0266822 | A1 * | 9/2014 | Henzler | G04F 10/005 341/118 |
| 2018/0131503 | A1 * | 5/2018 | Duan | H04L 7/0012 |

OTHER PUBLICATIONS

Yahya Tousi, Alberto Valdes-Garcia, "A Ka-band Digitally-Controlled Phase Shifter with sub-degree Phase Precision," 2016 IEEE Radio Frequency Integrated Circuits Symposium.

* cited by examiner

*Primary Examiner* — Cassandra F Cox
(74) *Attorney, Agent, or Firm* — Eschweiler & Potashnik, LLC

(57) ABSTRACT

In a phase modulation method enable signals may be sequentially generating based on a clock signal to generate a sequence of enable signals, and a signal is delayed by delay values generated from delay cells based on the sequence of enable signals and digital bit values. A phase modulator may include a first delay circuit configured to: delay a clock signal based on a first delay value to generate a first delayed clock signal, and delay a carrier signal based on the first delayed clock signal to generate a first delayed carrier signal; and a second delay circuit configured to: delay the first delayed clock signal based on a second delay value to generate a second delayed clock signal, and delay the first delayed carrier signal based on the second delayed clock signal to generate a second delayed carrier signal.

20 Claims, 15 Drawing Sheets

PHASE MODULATION SYSTEMS AND METHODS

BRIEF DESCRIPTION OF THE DRAWINGS/FIGURES

The accompanying drawings, which are incorporated herein and form a part of the specification, illustrate the aspects of the present disclosure and, together with the description, further serve to explain the principles of the aspects and to enable a person skilled in the pertinent art to make and use the aspects.

The exemplary aspects of the present disclosure will be described with reference to the accompanying drawings. The drawing in which an element first appears is typically indicated by the leftmost digit(s) in the corresponding reference number.

DETAILED DESCRIPTION

In the following description, numerous specific details are set forth in order to provide a thorough understanding of the aspects of the present disclosure. However, it will be apparent to those skilled in the art that the aspects, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the disclosure.

Aspects described herein generally relate to phase modulation systems and methods, including polar phase modulation systems and methods, such as polar phase modulators. Aspects can also include wireless networks, wireless communications, and corresponding wireless communication devices implementing one or more polar modulation systems (e.g. polar phase modulators).

The aspects of the present disclosure will be described with reference to wireless systems configured for the millimeter wave (mmWave) spectrum (e.g., 24 GHz-300 GHz), but is not limited thereto. In one or more aspects, the system is configured to operate with a carrier frequency of 71-76 GHz and a carrier signal bandwidth of 2 GHz, but is not limited thereto. The aspects of the present disclosure may be applied to fifth generation (5G) wireless technologies and related spectrums, or other wireless technologies and spectrums as would be understood by one of ordinary skill in the relevant arts.

Wireless communications are expanding into communications having increased data rates (e.g., from Institute of Electrical and Electronics Engineers (IEEE) 802.11a/g to IEEE 802.11n to IEEE 802.11ac and beyond). Currently, 5G cellular communication and Wireless Gigabit Alliance (WiGig) standards are being introduced for wireless cellular devices and/or Wireless Local Area Networks (WLAN).

Some aspects of the present disclosure relate to wireless local area networks (WLANs) and Wi-Fi networks including networks operating in accordance with the Institute of Electrical and Electronics Engineers (IEEE) 802.11 family of standards, such as the IEEE 802.11ac, IEEE 802.11ad and IEEE 802.11ay standards, the IEEE 802.11ax study group (SG) (named DensiFi) and Wireless Gigabit Alliance (WiGig). Other Aspects of the present disclosure pertain to mobile wireless communication devices such as the 4G and 5G cellular communication standards. The technical field more specifically pertains to radar systems and radar systems that can be implemented in communication systems.

Figure 1:
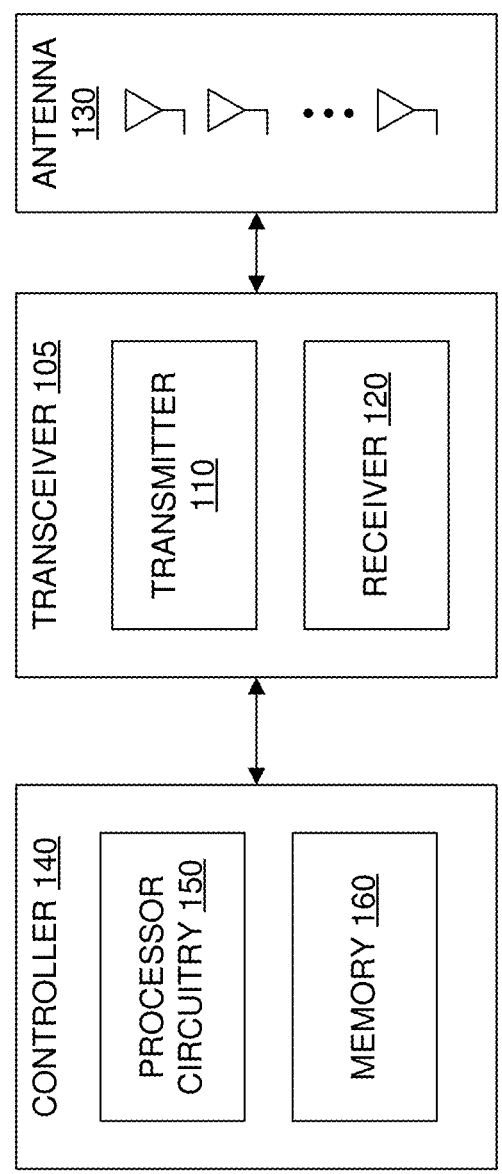
FIG. 1 illustrates a communication device according to exemplary aspects of the present disclosure.

FIG. 1 illustrates a communication device 100 according to an exemplary aspect of the present disclosure. The communication device 100 is configured to transmit and/or receive wireless communications via one or more wireless technologies. For example, the communication device 100 can be configured for wireless communications conforming to, for example, one or more fifth generation (5G) cellular communication protocols, such as 5G protocols that use the 28 GHz frequency spectrum, and/or communication protocols conforming to the Wireless Gigabit Alliance (WiGig) standard, such as IEEE 802.11ad and/or IEEE 802.11ay that use the 60 GHz frequency spectrum. The communication device 100 is not limited to these communication protocols and can be configured for one or more additional or alternative communication protocols, such as one or more 3rd Generation Partnership Project's (3GPP) protocols (e.g., Long-Term Evolution (LTE)), one or more wireless local area networking (WLAN) communication protocols, and/or one or more other communication protocols as would be understood by one of ordinary skill in the relevant arts. For example, the communication device 100 can be configured to transmit and/or receive wireless communications using one or more communication protocols that utilize the millimeter wave (mmWave) spectrum (e.g., 24 GHz-300 GHz), such as WiGig (IEEE 802.11ad and/or IEEE 802.11ay) which operates at 60 GHz, and/or one or more 5G protocols using, for example, the 28 GHz frequency spectrum.

The communication device 100 can be configured to communicate with one or more other communication devices, including, for example, one or more base stations, one or more access points, one or more other communication devices, and/or one or more other devices as would be understood by one of ordinary skill in the relevant arts.

In an exemplary aspect, the communication device 100 includes a controller 140 communicatively coupled to one or more transceivers 105.

The transceiver(s) 105 is configured to transmit and/or receive wireless communications via one or more wireless technologies. In an exemplary aspect, the transceiver 105 includes processor circuitry that is configured for transmitting and/or receiving wireless communications conforming to one or more wireless protocols.

In an exemplary aspect, the transceiver 105 includes a transmitter 110 and a receiver 120 configured for transmitting and receiving wireless communications, respectively, via one or more antennas 130. In aspects having two or more transceivers 105, the two or more transceivers 105 can have their own antenna 130, or can share a common antenna via a duplexer. In an exemplary aspect, the transceiver 105 (including the transmitter 110 and/or receiver 120) is configured to perform one or more baseband processing functions (e.g., media access control (MAC), encoding/decoding, modulation/demodulation, data symbol mapping; error correction, etc.).

In an exemplary aspect, the transmitter 110 is a polar transmitter 110 configured to perform one or more polar modulation operations and the receiver 120 is a Cartesian receiver 120 configured to perform one or more Cartesian demodulation operations (e.g. demodulate in-phase and quadrature phase components of the received signal). In these aspects, the transmitter 110 is a polar transmitter and the receiver 120 is a Cartesian receiver, but the present disclosure is not limited thereto. In other aspects, the receiver 120 is also a polar receiver that is configured to perform one or more polar demodulation operations.

The antenna 130 can include one or more antenna elements forming an integer array of antenna elements. In an exemplary aspect, the antenna 130 is a phased array antenna that includes multiple radiating elements (antenna elements) each having a corresponding phase shifter. The antenna 130 configured as a phased array antenna can be configured to perform one or more beamforming operations that include generating beams formed by shifting the phase of the signal emitted from each radiating element to provide constructive/destructive interference so as to steer the beams in the desired direction.

In an exemplary aspect, the controller 140 includes processor circuitry 150 that is configured to control the overall operation of the communication device 100, such as the operation of the transceiver(s) 105. The processor circuitry 150 may be configured to control the transmitting and/or receiving of wireless communications via the transceiver(s) 105.

In an exemplary aspect, the processor circuitry 150 is configured to perform one or more baseband processing functions (e.g., media access control (MAC), encoding/decoding, modulation/demodulation, data symbol mapping; error correction, etc.) in cooperation with the transceiver 105 or instead of such operations/functions being performed by the transceiver 105. The processor circuitry 150 is configured to run one or more applications and/or operating systems; power management (e.g., battery control and monitoring); display settings; volume control; and/or user interactions via one or more user interfaces (e.g., keyboard, touchscreen display, microphone, speaker, etc.) in one or more aspects.

In an exemplary aspect, the controller 140 further includes a memory 160 that stores data and/or instructions, where when the instructions are executed by the processor circuitry 150, controls the processor circuitry 150 to perform the functions described herein.

The memory 160 may be any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory 160 can be non-removable or removable, or a combination of both.

Examples of the communication device 100 include (but are not limited to) a mobile computing device (mobile device)—such as a laptop computer, a tablet computer, a mobile telephone or smartphone, a "phablet," a personal digital assistant (PDA), and mobile media player; a wearable computing device—such as a computerized wrist watch or "smart" watch, and computerized eyeglasses; and/or internet-of-things (IoT) device. In some aspects of the present disclosure, the communication device 100 may be a stationary communication device, including, for example, a stationary computing device—such as a personal computer (PC), a desktop computer, television, smart-home device, security device (e.g., electronic/smart lock), automated teller machine, a computerized kiosk, and/or an automotive/aeronautical/maritime in-dash computer terminal.

In one or more aspects, the communication device 100 or one or more components of the communication device 100 is additionally or alternatively configured to perform digital signal processing (e.g., using a digital signal processor (DSP)), modulation and/or demodulation (using a modulator/demodulator), a digital-to-analog conversion (DAC) and/or an analog-to-digital conversion (ADC) (using a respective DA and AD converter), an encoding/decoding (e.g., using encoders/decoders having convolution, tail-biting convolution, turbo, Viterbi, and/or Low Density Parity Check (LDPC) encoder/decoder functionality), frequency conversion (using, for example, mixers, local oscillators, and filters), Fast-Fourier Transform (FFT), preceding, and/or constellation mapping/de-mapping to transmit and/or receive wireless communications conforming to one or more wireless protocols and/or facilitate the beamforming scanning operations and/or beamforming communication operations.

Figure 2:
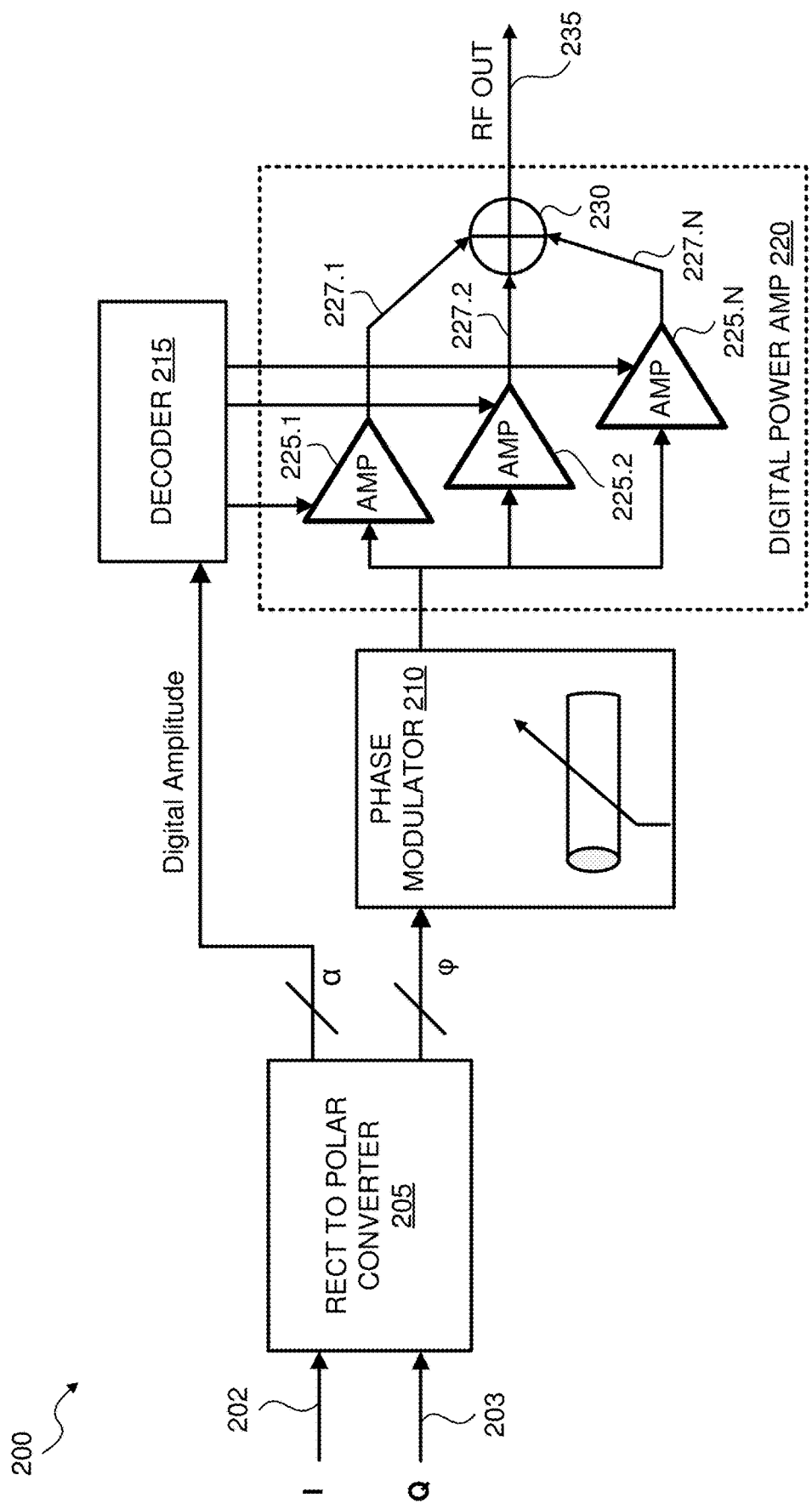
FIG. 2 illustrates a polar transmitter according to an exemplary aspect of the present disclosure.

FIG. 2 illustrates a transmitter 200 according to an exemplary aspect of the present disclosure. In an aspect, the transmitter 200 is an embodiment of transmitter 110.

In an exemplary aspect, the transmitter 200 includes a rectangular-to-polar converter 205, phase modulator 210, decoder 215, and digital power amplifier 220. In an exemplary aspect, the digital power amplifier 220 includes one or more amplifiers 225.1 to 225.N and an adder 230. In an exemplary aspect, the amplifier(s) 225 are power amplifier sub-cells.

In an exemplary aspect, rectangular-to-polar converter 205 is configured to receive an input signal having an in-phase component 202 and a quadrature component 203, and to convert the rectangular in-phase component (I) 202 and the quadrature component (Q) 203 to polar output signal having amplitude ($\alpha$) and phase ($\varphi$) components. In an exemplary aspect, the rectangular-to-polar converter 205 includes processor circuitry that is configured to convert the rectangular in-phase component (I) 202 and the quadrature component (Q) 203 to polar output signal having amplitude (α) and phase (φ) components. In an exemplary aspect, the rectangular-to-polar converter 205 includes digital circuitry that is configured to convert the rectangular in-phase component (I) 202 and the quadrature component (Q) 203 to polar output signal having amplitude (α) and phase (φ) components.

In an exemplary aspect, the amplitude (α) and phase (φ) components are determined based on the following equations:

$$\alpha = \sqrt{I^2 + Q^2}$$
$$\varphi = \tan^{-1}\frac{Q}{I}$$

In an exemplary aspect, the phase modulator 210 is configured to receive the phase (φ) component from the rectangular-to-polar converter 205, and modulate the phase to generate one or more phase modulated (e.g. phase shifted) signals. The phase modulated signal(s) may be provided to the digital power amplifier 220, such as to the respective amplifiers 225 of the digital power amplifier 220. In an exemplary aspect, the phase modulator 210 is a polar phase modulator. In an exemplary aspect, the phase modulator 210 includes processor circuitry (e.g. digital circuitry) that is configured to modulate the phase to generate one or more phase modulated (e.g. phase shifted) signals. Further aspects of the phase modulator 210 are described with reference to FIGS. 3 and 4.

In an exemplary aspect, the decoder 215 is configured to receive the amplitude (α) from the rectangular-to-polar converter 205, and decode the amplitude (α) to generate one or more decoded signals. In an exemplary aspect, the decoded signals are envelope control signals. The decoded signal(s) may be provided to the digital power amplifier 220, such as to the respective amplifiers 225 of the digital power amplifier 220. In an exemplary aspect, the decoded signals provided to the amplifiers 225 operate as control signals (e.g. envelope control signals) to either turn ON or OFF the digital power amplifier 220 adjust the output power of digital power amplifier 220 or to modulate the envelope of the RF output signal. In an exemplary aspect, the decoded signals provided to the amplifiers 225 operate as control signals to gain of the respective amplifiers 225. In an exemplary aspect, the decoder 215 includes processor circuitry (e.g. digital circuitry) that is configured to decode the amplitude (α) to generate one or more decoded signals (e.g. control signals to modulate the envelope of the digital power amplifier 220).

In an exemplary aspect, the digital power amplifier 220 is configured to receive the phase modulated (e.g. phase shifted) signal(s) from the phase modulator 210 and the decoded signal(s) from the decoder 215, and generate a radio frequency (RF) output signal 235 based on the received phase modulated (e.g. phase shifted) signal(s) and the decoded signal(s).

In an exemplary aspect, the amplifier(s) 225 are either turned ON or OFF depending upon the control signal(s) (e.g. envelope control signal(s)) from decoder 215. The output from the amplifiers 225 are then summed/added by the adder 230 to produce an envelope modulated RF output signal 235.

In an exemplary aspect, the amplified signal(s) 227 are provided to the adder (or summer) 230. The adder 230 is configured to combine the amplified signals 227 to generate the RF output signal 235 (e.g. envelope modulated RF output signal). In an exemplary aspect, the adder 230 is configured to add the amplified signals 227 together to generate the RF output signal 235. The RF output signal 235 may then be provided to antenna (e.g. antenna 130) to be transmitted.

Figure 3:
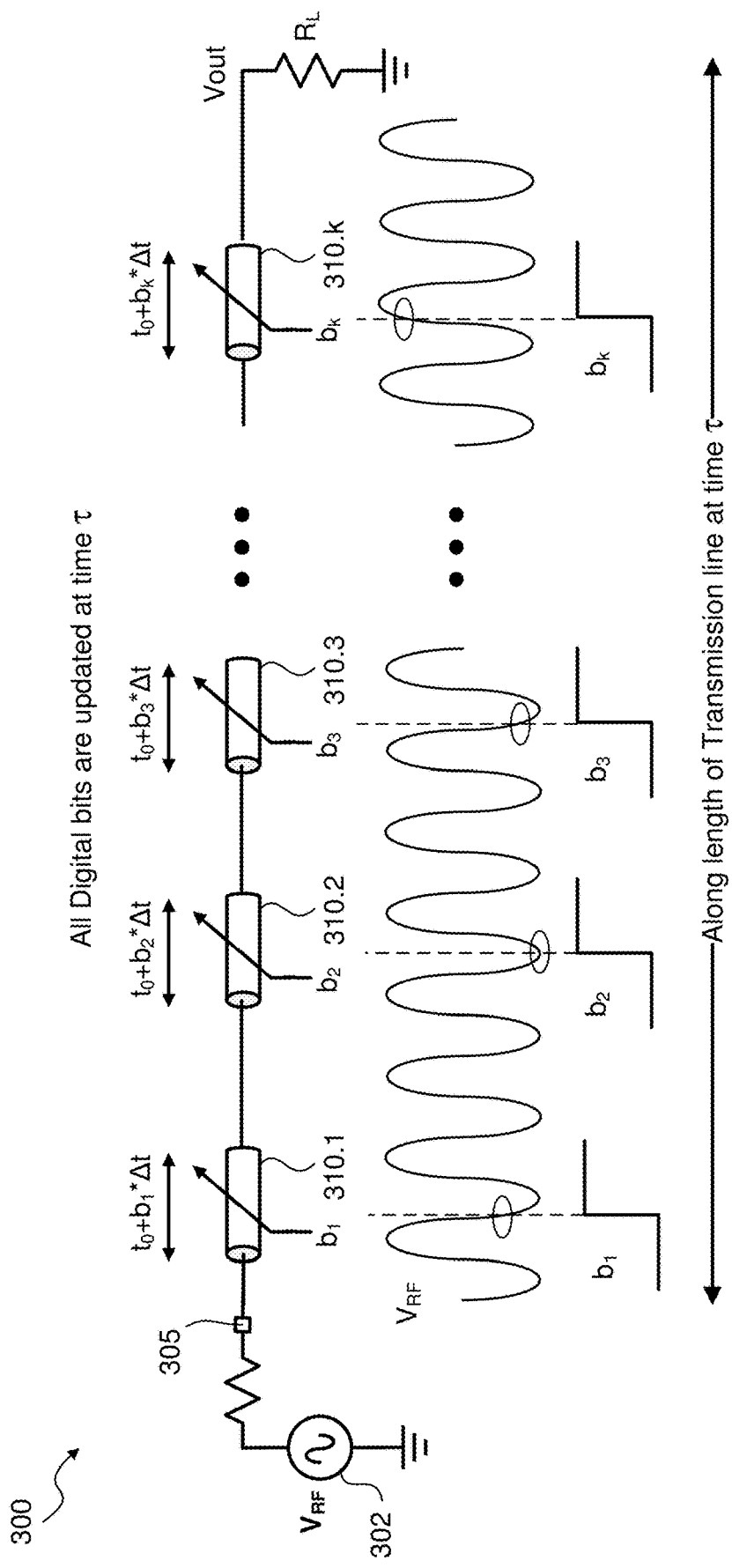
FIG. 3 illustrates a phase modulator according to an exemplary aspect of the present disclosure.

FIG. 3 illustrates a phase modulator 300 according to an exemplary aspect of the present disclosure. In an exemplary aspect, the phase modulator 300 is an embodiment of the phase modulator 210.

In an exemplary aspect, the phase modulator 300 includes an artificial transmission line (ATL) having an input 305 that receives an input signal $V_{RF}$, from, for example, an unmodulated frequency generator (e.g. at mmWave frequency). In an exemplary aspect, the unmodulated frequency generator is a mmWave phase-locked loop (PLL). In this example, the digital control bits $b_1$ to $b_k$ correspond to the phase (φ) component from the rectangular-to-polar converter 205. In an exemplary aspect, the phase modulator 300 includes one or more delay cells 310.1 to 310.K that are configured to delay a received signal (e.g. the input signal or output from a previous delay cell 310) to generate a respective delayed signal. In an exemplary aspect, the delay cells 310.1 to 310.K are configured to delay a received signal based on a respective digital bit $b_1$ to $b_k$. In an exemplary aspect, the delay cells 310.1 to 310.K are arranged consecutively (e.g. cascading) to form the transmission line. In an exemplary aspect, the delay $t_d$ of a delay cell 310 satisfies the following equation:

$$t_d = t_0 + b_x \Delta t$$

where $t_0$ is input to the delay cell, b is the digital bit where x corresponds to the number within the sequence of delay cells, and $\Delta t$ is a delay constant. In an exemplary aspect, all the digital bits $b_1$ to $b_k$ are updated at time τ (i.e., all the bits are updated at the same time/simultaneously).

In an exemplary aspect, the phase modulator 300 is configured to linearly phase shift the input signal. In an exemplary aspect, due to the passive structure of the phase modulator realized using a transmission line (e.g. ATL), the phase modulator 300 advantageously reduces process, voltage, temperature (PVT) variations (e.g. compared to active phase modulation systems), supports large bandwidth due to dispersion free propagation and small impedance/insertion loss variation across phase shift code. As shown in FIG. 3, in the phase modulator 300 phase shifter, phase shift code (i.e. the digital bits b) at each delay cell 310 are changed simultaneously at time instant $\tau_0$. In this example, an instantaneous phase shift is produced at each delay cell 310. With this instantaneous phase shift, the phase shift at a particular delay cell 310 is realized at the output (e.g. at RL) only after passing through all of the subsequent delay cells 310 in the consecutive arrangement. For example, the phase shift at delay cell 310.1 is realized at the output only after propagating through all the subsequent delay cells 310.2 to 310.K. In operation, any change in delay occurring at earlier stages (e.g. delay cell 310.1) take a longer time to appear at the output of the phase modulator 300 compared to later stages (e.g. delay cell 310.3) in the consecutive arrangement. In an aspect, worst case settling time of the phase modulator 300 phase shifter is limited by the propagation delay starting from the first delay cell 310.1 in the transmission line. As shown in the lower portion of FIG. 3, as the digital bits $b_1$ to $b_k$ are updated simultaneously, the delay is applied to different points on the unmodulated carrier waveform ($V_{RF}$).

Figure 4:
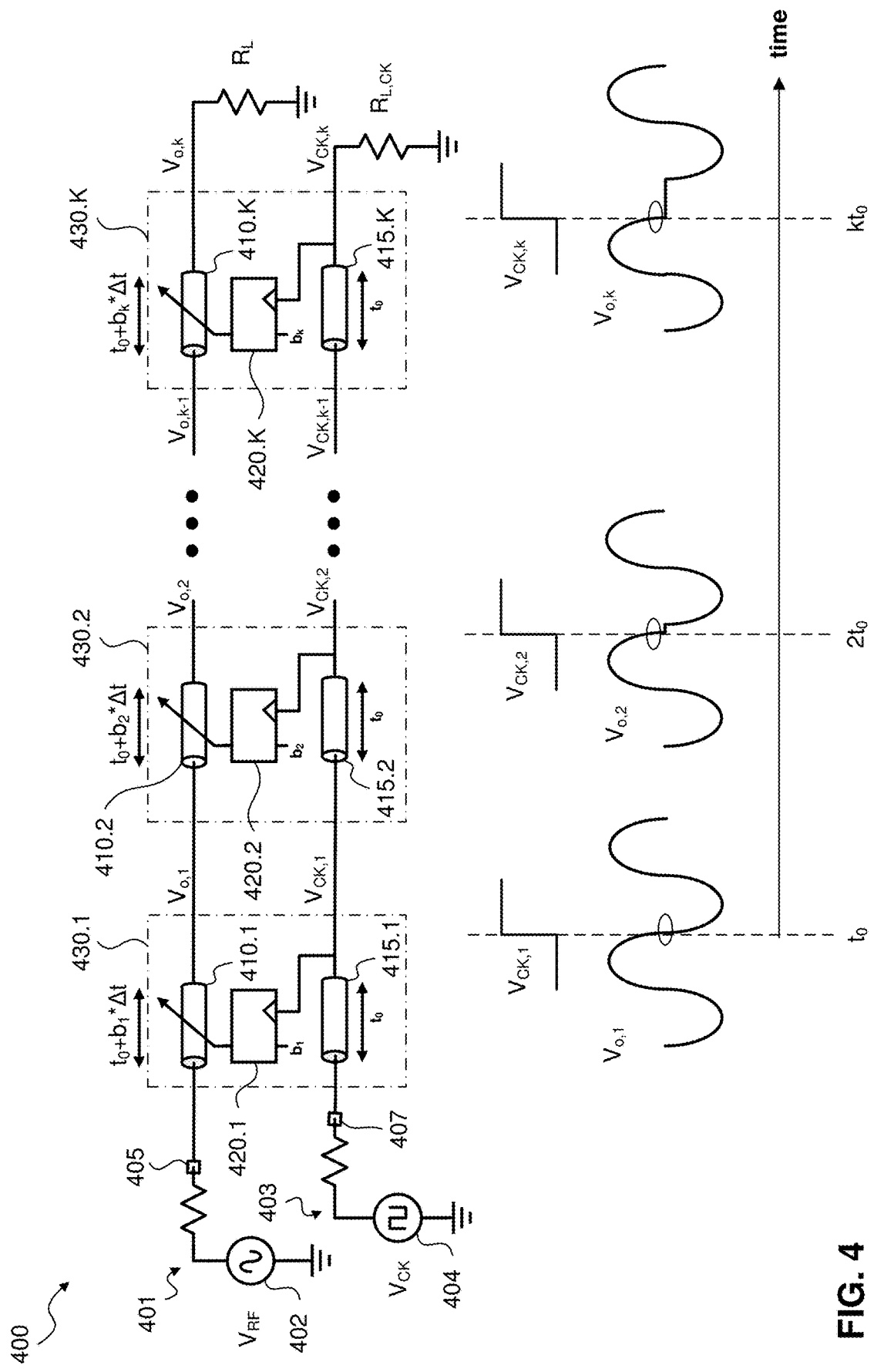
FIG. 4 illustrates a phase modulator according to exemplary aspects of the present disclosure.

FIG. 4 illustrates a phase modulator 400 according to an exemplary aspect of the present disclosure. In an exemplary aspect, the phase modulator 400 is an embodiment of the phase modulator 210.

In an exemplary aspect, the phase modulator 400 includes first and second artificial transmission lines (ATL) 401 and 403. In an aspect, the ATL 401 is similar to the ATL of phase modulator 300.

In an exemplary aspect, the phase modulator 400 includes one or more delay circuits 430.1 to 430.K. In an aspect, the delay circuits 430.1 to 430.K are consecutively arranged along the ATLs 401 and 403. In this arrangement, delay circuit 430.1 is arranged closer to inputs 405 and 407 of the ATLs 401 and 403, respectively, while delay circuit 430.K is located closer to the respective outputs of the ATLs 401 and 403 (e.g. $R_L$ and $R_{L,CK}$).

In an exemplary aspect, one or more (or each) of the delay circuits 430 includes a first delay cell 410, a second delay cell 415, and a memory 420. In an exemplary aspect, the memory 420 is a retiming circuit 420. In an exemplary aspect, the memory 420 (retiming circuit 420) is a flip-flop or latch, but is not limited thereto. In an exemplary aspect, the memory 420 is a D flip-flop (i.e. data or delay flip-flop), and includes an enable input, a data input to receive a data bit, and a data output that is configured to output a bit value at the data input based on a signal value at the enable input. For example, if the data input has a bit value of "1", the data output will output the bit value of "1" at a next rising edge of a clock signal provided to the enable input. In this example, the flip-flop 420 is clocked (synchronous or edge-triggered) flip-flop.

In an exemplary aspect, the ATL 401 is a transmission line based phase shifter that carries the carrier signal $V_{RF}$ (e.g. unmodulated mmWave sinusoid carrier signal) and the ATL 403 carries a sampling clock $V_{CK}$. In an exemplary aspect, the delay cells 410 of the delay circuit 430 are configured to delay a received signal (e.g. the input carrier signal $V_{RF}$ or output from a previous delay cell 410) to generate a respective delayed signal. For example, the delay cell 410 receives the input carrier signal $V_{RF}$ (e.g. the phase (φ) component from the rectangular-to-polar converter 205) and generates a delayed output $V_{O,1}$ corresponding to the input carrier signal $V_{RF}$ that is delayed by a delay value. In an exemplary aspect, the delayed output of the delay cell 410 satisfies the following equation:

$$V_O = t_0 + b_x \Delta t$$

where $t_0$ is the input to the delay cell, b is the digital bit where x corresponds to the number within the sequence of delay cells, and Δt is a delay constant.

In an exemplary aspect, each of the flip-flops 420.1 to 420.K are configured to receive a respective digital bit $b_1$ to $b_k$ at their corresponding data input. The flip-flop 420 is configured to output the digital bit b, based on the sampling clock $V_{CK}$ received from the ATL 403. In an exemplary aspect, the second delay cell 415 of the corresponding delay circuit 430 is configured to delay a received signal (e.g. the received clock signal $V_{CK}$ or output from a previous delay cell 415) to generate a respective delayed clock signal. In an exemplary aspect, the delay cells 415.1 to 415.K have a same, fixed delay (e.g. fixed delay equal to $t_0$). The disclosure is not limited to common fixed delays and in other aspects, the delay of the delay cells 415 are variable and/or are different.

In an exemplary aspect, the delay cells 415.1 to 415.K are arranged consecutively (e.g. cascading) along the ATL 403 carrying the clock signal $V_{CK}$. In an exemplary aspect, the delay $t_{CK}$ of a delay cell 415 satisfies the following equation:

$$t_{CK} = t_{IN} + t_0$$

where $t_{IN}$ is input to the delay cell 415 and to is the delay (e.g. fixed delay) of the delay cell 415.

In an exemplary aspect, based on the consecutive arrangement, the delay t0 of each delay cell 415 is additive. For example, the outputs of the delay cells 415.1 to 415.K are delayed by $t_0, 2t_0, \ldots, kt_0$, respectively. In operation, based on the incremented delay of the clock signal, the respective flip-flops 420 are enabled sequentially along the ATL 403. For example, the flip-flops 420.1 to 420.K are enabled at times $t_0, 2t_0, \ldots, kt_0$, respectively. As a result, the delay cells 410.1 to 410.K are enabled based on corresponding bits $b_1$ to $b_k$ at times $t_0, 2t_0, \ldots, kt_0$, respectively. This sequential enablement is different from the operation of the phase modulator 300 where the digital bits $b_1$ to $b_k$ are updated simultaneously.

In an exemplary aspect, the delay of both ATLs 401, 403 are matched by layout to first order such that the rising edge of the sampling clock arrives at a delay cell 415 after going through a similar (or the same) delay as the RF signal through the main phase shifter 410. In this example, the sampling clock retimes the phase shift code by flip-flops 420.

In an exemplary operation, both carrier and phase shift code in the phase modulator 400 are applied at $i^{th}$ delay circuit 430 with identical delays of $i \times t_0$. The resultant change in delay at output node $V_{o,i}$ is applied to the same point on the carrier waveform as the delay is added from all previous stages as shown in the lower portion of FIG. 4. In this example, instead of the ATL of phase modulator 300 where all codes are updated at the same time, the codes in the phase modulator 400 are applied after delay compensation and the change of delay (i.e. Δt) in each delay circuits are added coherently at the output. This advantageously provides a faster settling time as compared to the phase modulator 300. As a further advantage, phase modulator 400 has a robustness against PVT variation and achieves linear phase shift across the code. Also, the phase modulator 400 may be configured such that the phase modulator 400 is calibration free at mmWave frequencies.

Figure 5B:
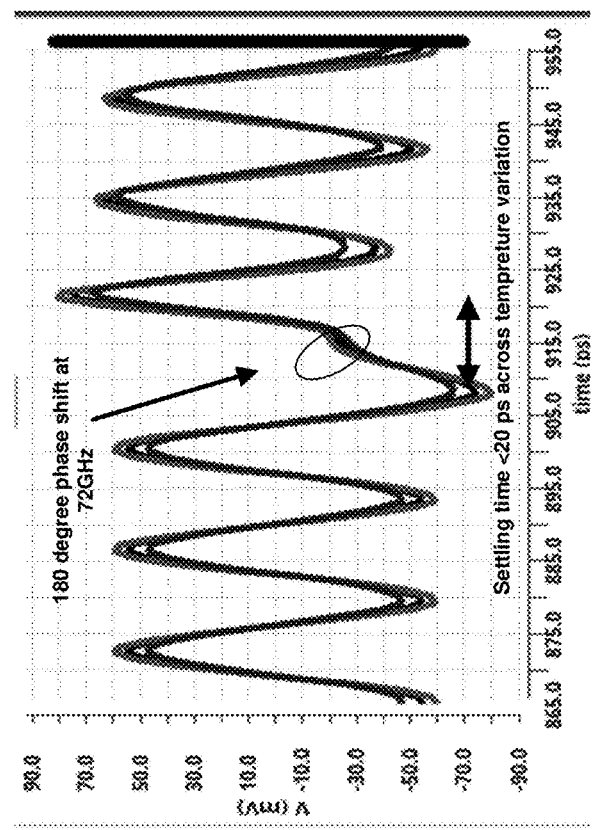
FIGS. 5A-5B illustrate settling time results based on process and temperature variations according to exemplary aspects of the present disclosure.
Figure 5A:
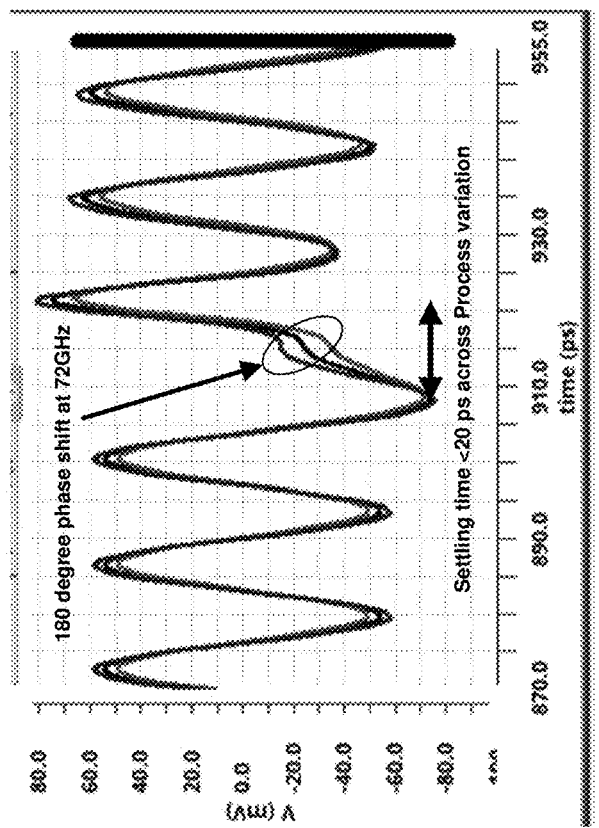
Figure 6B:
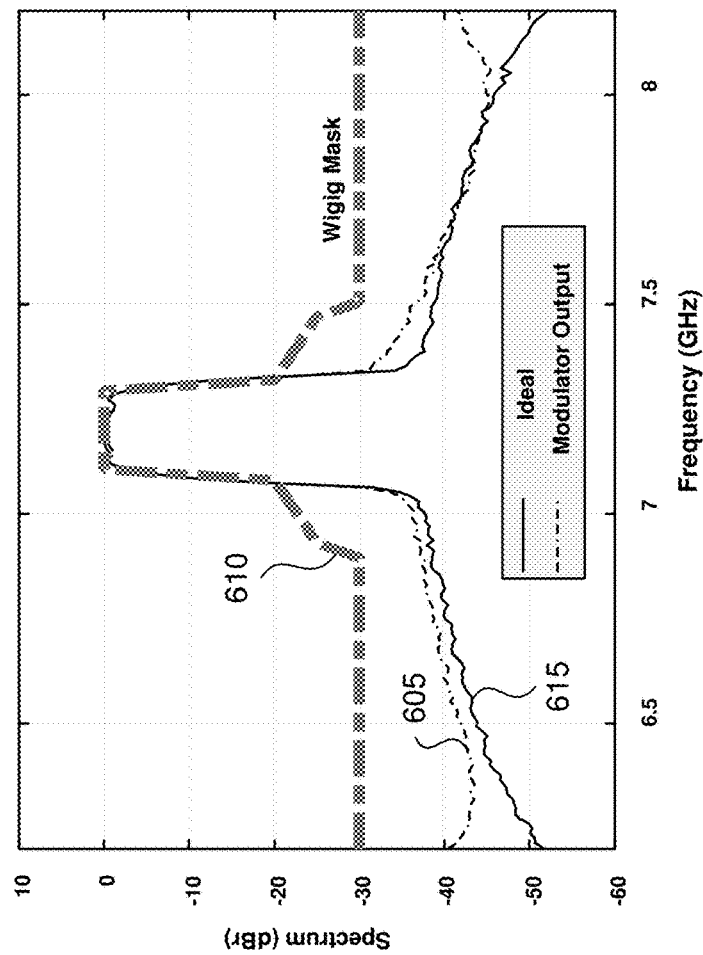
FIGS. 6A-6B illustrate a signal reconstruction and spectral analysis according to exemplary aspects of the present disclosure.
Figure 6A:
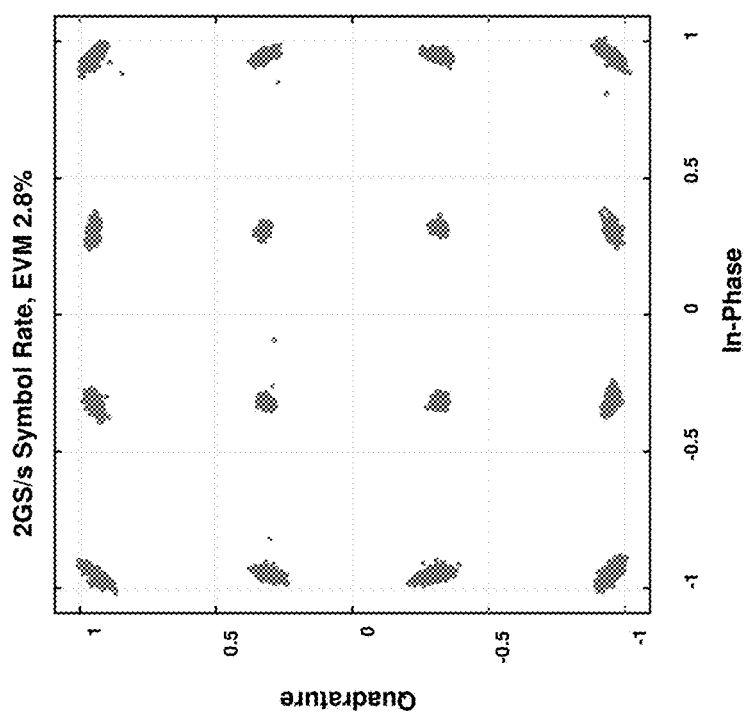

The performance of the phase modulator 400 is illustrated in FIGS. 5A to 6B. In FIG. 5A, it is shown that the phase modulator 400 exhibits a settling time of less than 20 picoseconds across process variations (e.g. across typical, slow and fast corner). Similarly, the phase modulator 400 exhibits a settling time of less than 20 picoseconds across temperature variations (Temperatures of −40, 27 and 110° C. for 180 degree phase shift at phase shifter output for 72 GHz carrier frequency) as shown in FIG. 5B. In these illustrations, the phase change happens less than 1 cycle of the waveform of 72 GHz carrier frequency which is <20 ps). FIG. 6A illustrates a constellation of 16QAM signal reconstructed in at 2 GS/s symbol rate, while FIG. 6B shows a spectral mask for WiGig (IEEE 802.11ad). In this example, the phase modulator exhibits better than −31 dB and 2.8% EVM while meeting the spectral mask without any PVT calibrations.

Figure 7A:
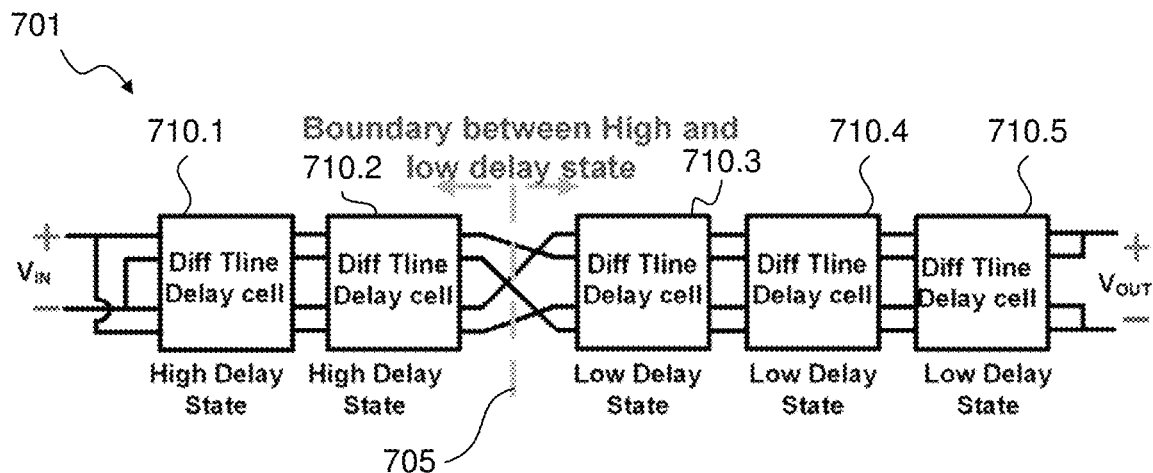
FIGS. 7A-7C illustrate phase modulators according to exemplary aspects of the present disclosure.
Figure 7B:
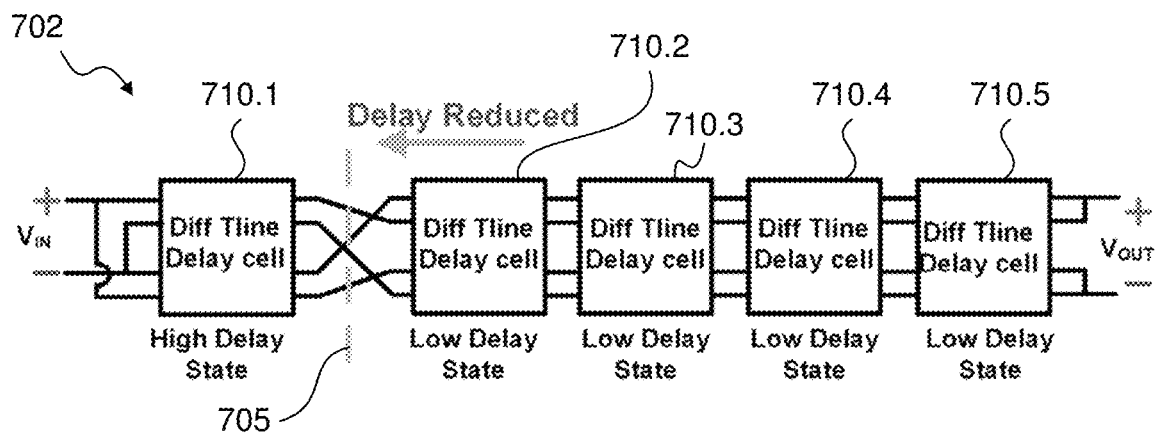
Figure 7C:
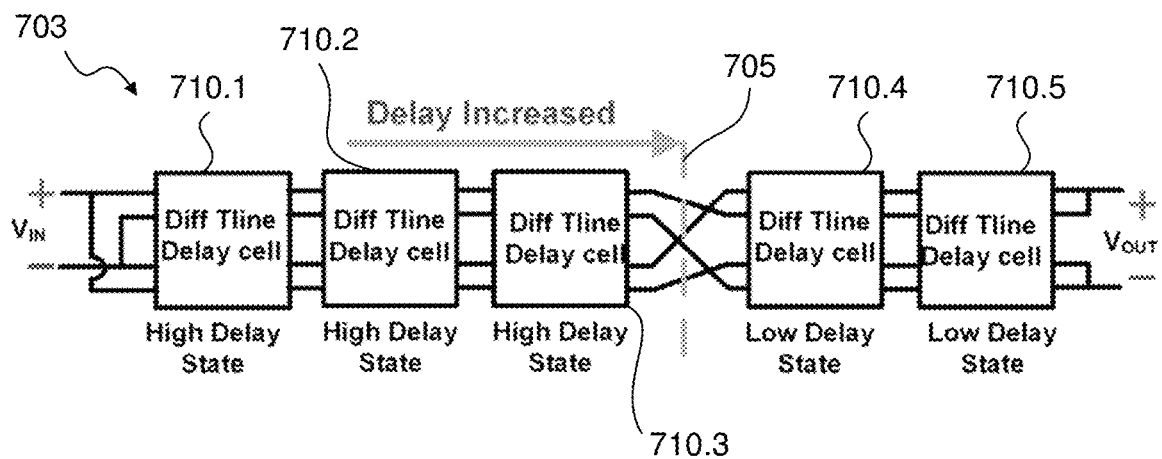

FIGS. 7A-7C illustrates a phase modulator 700 according to an exemplary aspect of the present disclosure. In these drawings, exemplary operating states 701, 702, and 703 of the phase modulator are illustrated. In an exemplary aspect, the phase modulator 700 is an embodiment of the phase modulator 210.

In an exemplary aspect, the phase modulator 700 includes one or more delay cells 710 forming an artificial transmission line (ATL). In an exemplary aspect, the phase modulator 700 includes five delay cells 710.1 to 710.5, but is not limited thereto. The delay cells 710 are arranged consecutively, where the output of one delay cell 710 is provided as an input to a next delay cell 710 in the arrangement. In an exemplary aspect, the delay cells 710 are configured to selectively operate in high delay and low delay operating states. By selecting the delay states, a boundary 705 between a high delay state and a low delay state is shifted along the arrangement of the delay cells 710.

As shown in FIGS. 7A-7C, in an exemplary aspect, the delay cells 710.1 and 710.5 on the input and output are configured in the high delay state and low delay state, respectively, but is not limited thereto.

In an exemplary aspect, the total delay of the phase modulator 700 is the summation of the corresponding delay of each of the delay cells 710 forming the ATL structure. In an exemplary aspect, the phase modulator 700 is configured with a variable delay by adjusting the delay states (between high and low delay states) of one or more of the delay cells 710 along the ATL arrangement. The adjustment of the delay states moves the boundary 705 between the two edge delay cells 710.1 and 710.5 towards either the input side (delay cell 710.1) to reduce the delay (FIG. 7B) or to the output side (delay cell 710.5) to increase the delay of the ATL structure (FIG. 7C).

In an exemplary aspect, the phase modulator 700 is a differential ATL based phase modulator. In this example, phase modulator 700 receives a differential signal at the input side (i.e. input to delay cell 710.1). The two signals (positive "+" & negative "−") of the differential signal are each separated into two signals such that the delay cells 710 include four signal lines (two positive and two negative).

In an exemplary aspect, the delay states of each of the delay cells 710 are digitally controlled. As explained in more detail below, the phase modulator 700 provides a coarse phase shifter that advantageously reduces the active area and switching glitches. In an exemplary aspect, the phase modulator 700 configured as a coarse phase shifter is arranged in a cascade arrangement with a single-ended ATL based fine phase shifter to cover wide phase shift range with fine phase resolution. Further, the settling time of the phase modulator 700 advantageously supports high data rate with high phase accuracy over PVT. Moreover, due to the differential arrangement of the ATL, the phase modulator 700 produces negligible glitch during phase transition and immune to external noise.

Figure 8:
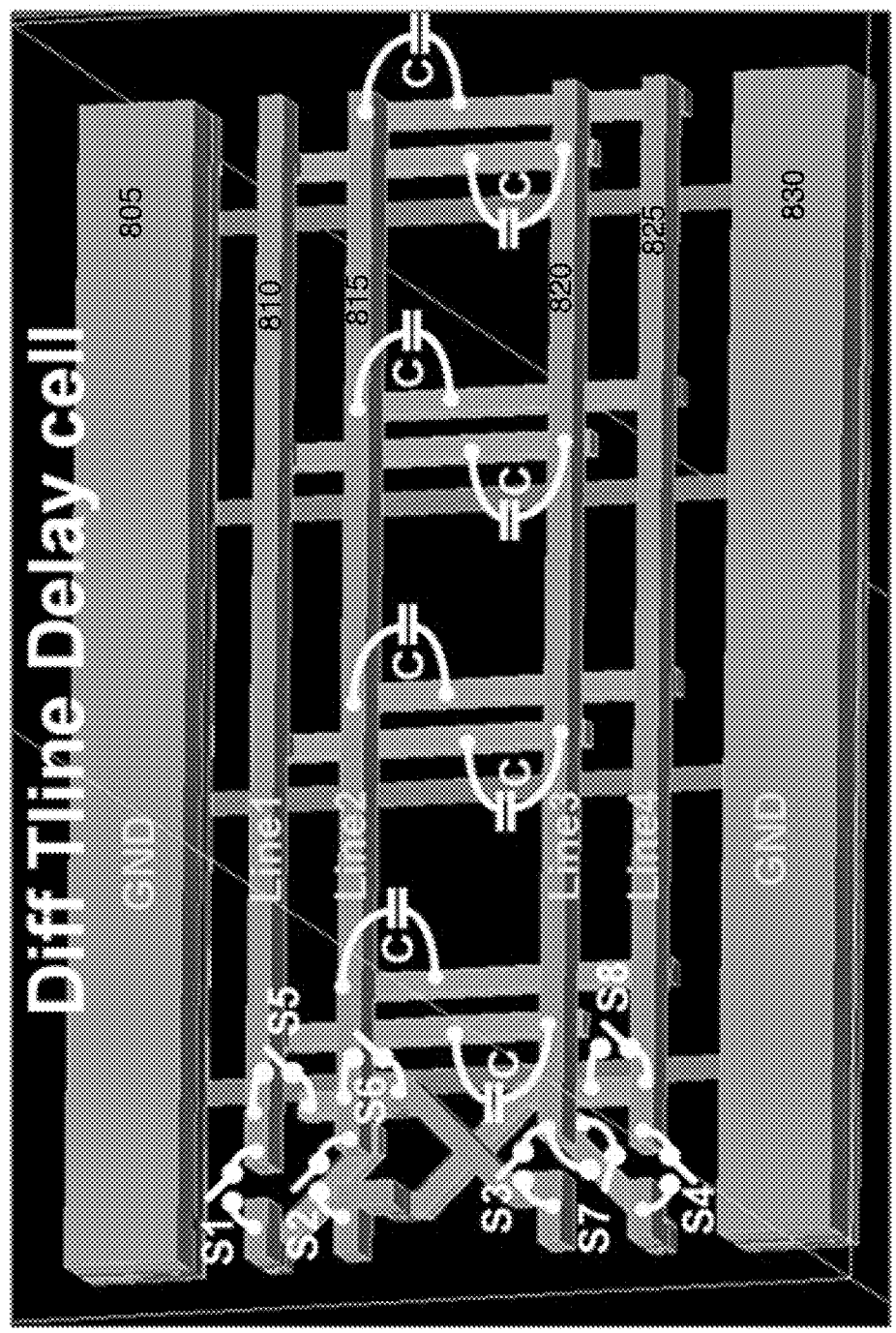
FIG. 8 illustrates a delay cell according to an exemplary aspect of the present disclosure.

FIG. 8 illustrates an exemplary aspect of the delay cell 710. In this aspect, the differential delay cell 710 includes two identical differential lines coupled to each other magnetically and electrically. The coupling strength can be programmed digitally by re-routing the differential signal paths using one or more switches (e.g. CMOS switches). This configuration advantageously leads to simultaneous changes in both inductance and capacitance per unit length of the ATL to vary the delay of the delay cell 710 while maintaining constant (or substantially constant) characteristic impedance and constant (or substantially constant) insertion loss across all phase settings. In addition, unwanted glitches produced from charge injection from the switches appear as common mode at the differential output and are thus advantageously rejected (see FIG. 12). In an exemplary aspect, both coarse and fine phase shifter arrangements are delay matched to an auxiliary transmission line (e.g. as in FIG. 4) which is used to re-time the digital phase shift code to achieve less than 20 ps settling time.

Figure 9:
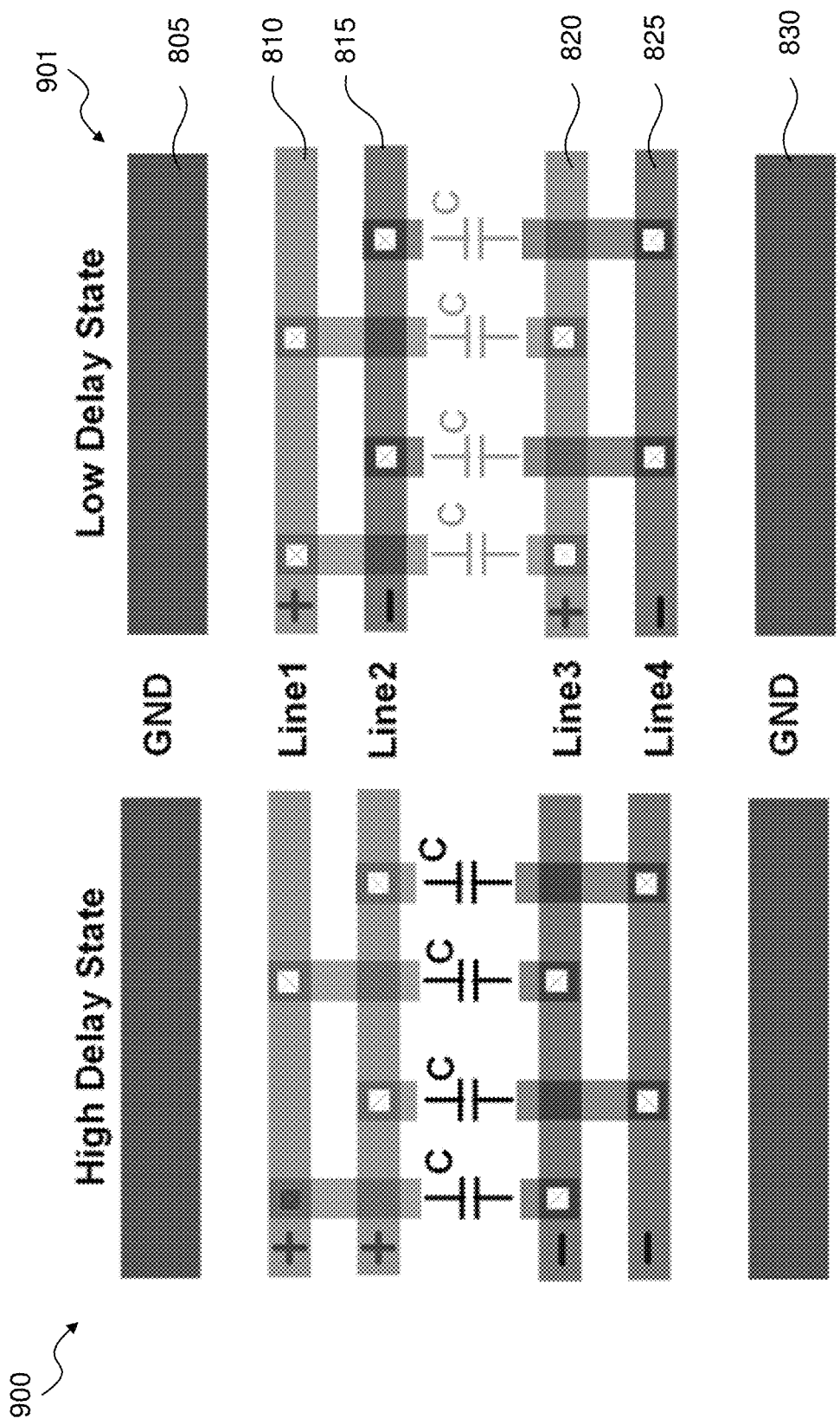
FIG. 9 illustrates a delay cell according to an exemplary aspect of the present disclosure.

With references to FIGS. 8 and 9, in an exemplary aspect, delay cell 710 includes four signal lines (Line 1-4) 810, 815, 820, 825, switches S1-S8, and capacitors that couple the positive lines to a respective negative line (e.g. Line 1 to Line 3, and Line 2 to Line 4) in one operation state (e.g. high), while couple positive to positive and negative to negative in another operation state (e.g. low).

Turning to FIG. 8, in an exemplary aspect, the differential input to the delay cell 710 enters from the left side and is connected to one or more of the switches S1-S8. In operation, the switched S1-S8 are configured to adjust the position of the positive lines with respect to the negative lines to move the boundary 705 either towards left or right (in FIGS. 7A-7C) to change delay of the phase modulator 700. In an exemplary aspect, when switches S1-S4 are switched ON (i.e. closed) and switches S5-S8 are switches OFF (open), the differential signals are connected (or otherwise coupled) straight through the delay cell 710 in the same configuration. Alternatively, when switch S5-S8 are turned ON (closed) and switches S1-S4 are turned OFF (open), the wire configuration is changed the other delay state, which adjusts the boundary 705 between the delay states.

As shown in FIG. 9, in the high delay state, Lines 1 and 2 (810, 815) have positive polarity and Lines 3 and 4 (820, 825) have negative polarity. In this arrangement, due to positive mutual coupling between the lines, the inductance increases. Alternatively, in the low delay state, Line 1 and Line 3 (810, 820) have positive polarity while Line 2 and Line 4 have negative polarity. In this configuration, as the return current with negative polarity is closer in proximity to a corresponding positive polarity signal line, less magnetic flux and inductance is generated.

In an exemplary aspect, with continued reference to FIG. 9, the capacitors C are connected differentially across the lines in high delay operating state (capacitors couple the positive lines to respective negative lines), and are connected in a common mode in the low delay operating state (capacitors couple the positive lines together and couple the negative lines together). For example, in the high delay operating state, positive line 1 (810) is coupled via one or more capacitors to negative line 3 (820), and positive line 2 (815) is coupled via one or more capacitors to negative line 4 (825). In the low delay operating state, positive line 1 (810) is coupled via one or more capacitors to positive line 3 (820), and negative line 2 (815) is coupled via one or more capacitors to negative line 4 (825). These configurations advantageously provide that the capacitance of line can be changed automatically in a lossless manner without using series switches found in a single-ended transmission line to maintain constant characteristic impedance between these delay states. Further, constant characteristic impedance of the line across the phase shift code is achieved.

In an exemplary aspect, switch S1-S8 are configured to be digitally programmable between the high and low operating states. Advantageously, the parasitic capacitance of the switches are always loaded on the line and the capacitors do not realize parasitic resonance behavior. Thus, the delay cell 710 achieves higher phase variation in a given area compared to a single ended transmission line.

In an exemplary aspect, the insertion loss is function of the number of switches in series (e.g. number of delay cells in cascade). Therefore, in an exemplary aspect, to minimize the insertion loss, the phase modulator 700 may be used to achieve a coarse phase shift, while fine phase resolution may be achieved through cascading the phase modulator 700 with a single ended transmission line based phase shifter. Additionally, the number of switches that are ON is constant (e.g. 4 switches) between the high and low delay states leading to constant insertion loss across phase shift range. This is desirable to reduce phase modulation to amplitude modulation distortion for the modulated signal.

Figure 12:
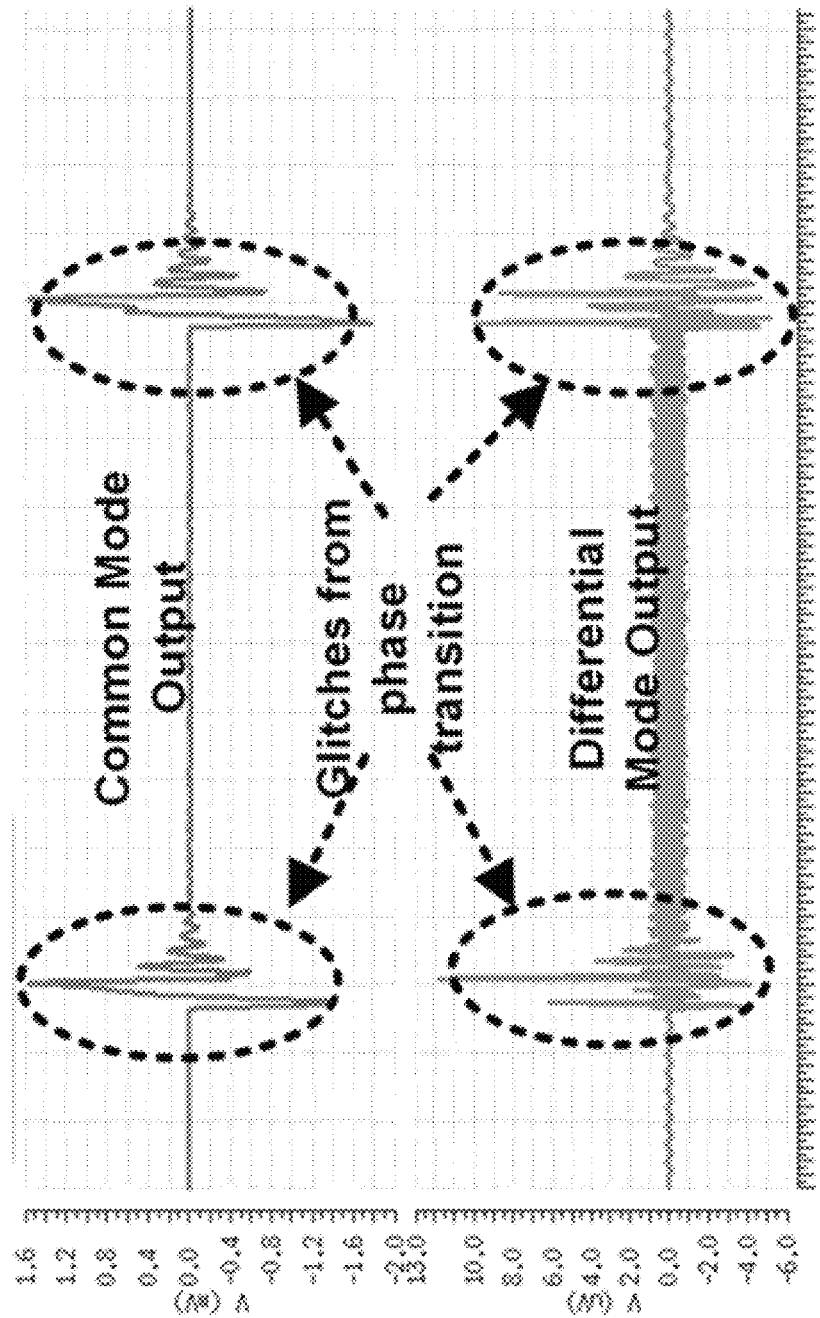
FIG. 12 illustrates phase transition performance according to exemplary aspects of the present disclosure.

As shown in FIG. 12, glitches produced during phase transition appear common to the differential line and appears as common mode, and therefore the glitches are rejected. A further advantage is that the phase modulator 700 is insensitive to external noise from nearby signal lines and circuits, while being robust against PVT variations. Further, the fast settling time is achieved by axillary transmission line configurations with delayed digital code to update the delay state in each delay cell as in the aspects shown in FIG. 4.

Figure 10:
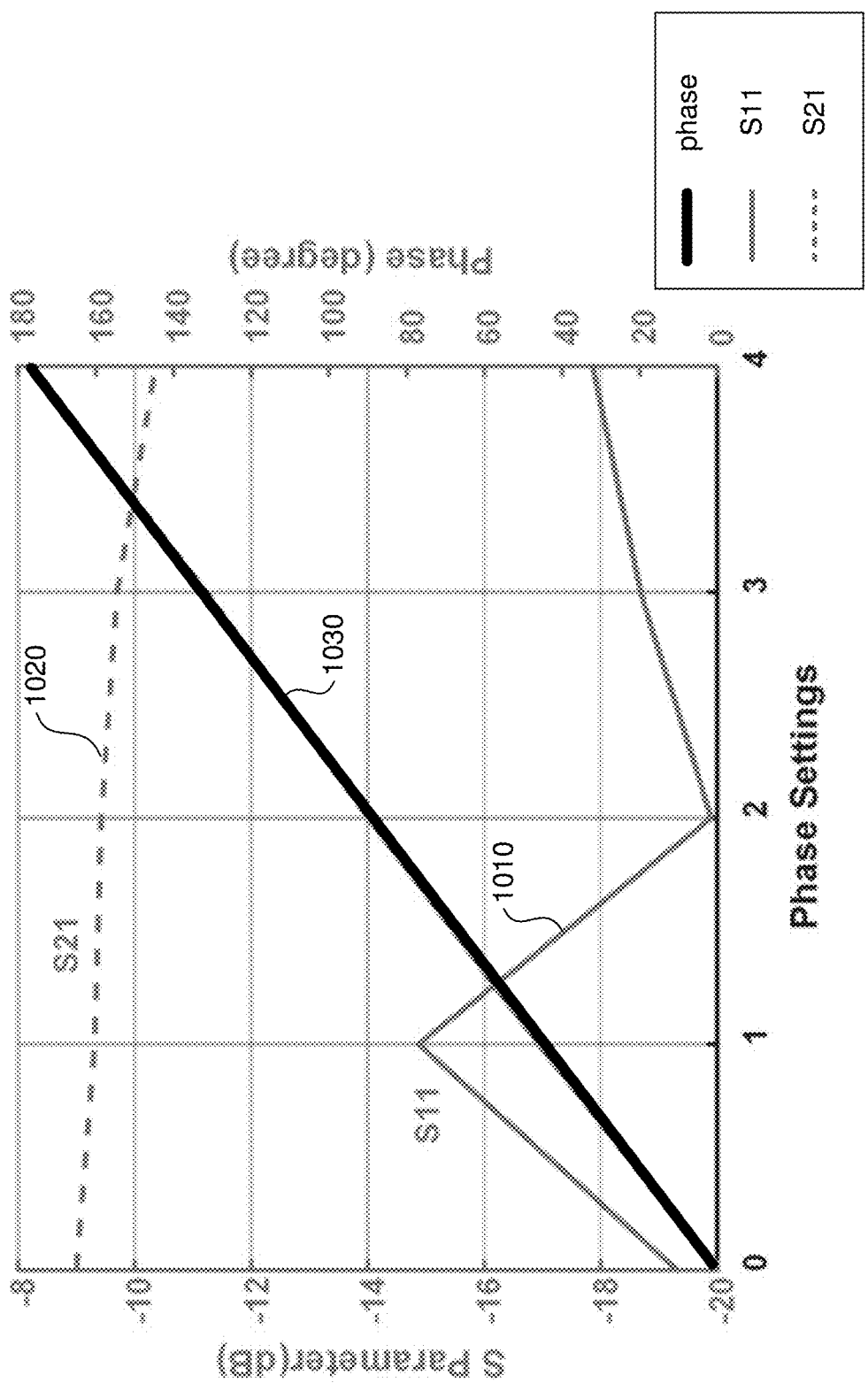
FIG. 10 illustrates an insertion loss analysis and an input matching analysis based on phase according to exemplary aspects of the present disclosure.

Further advantages and performance characteristics are illustrated in FIGS. 10-13B. For example, as shown in FIG. 10, shows a simulated input matching (S11), insertion loss (S21) and phase shift across phase shift code. In this example, a constant insertion loss of 9 dB is achieved and maintained constant characteristic impedance across the phase shift range. Further, the phase modulator 700 consumes one third of the area compared to a single-ended phase shifter while providing 180 degree phase shift range.

Figures 11A, 11B:
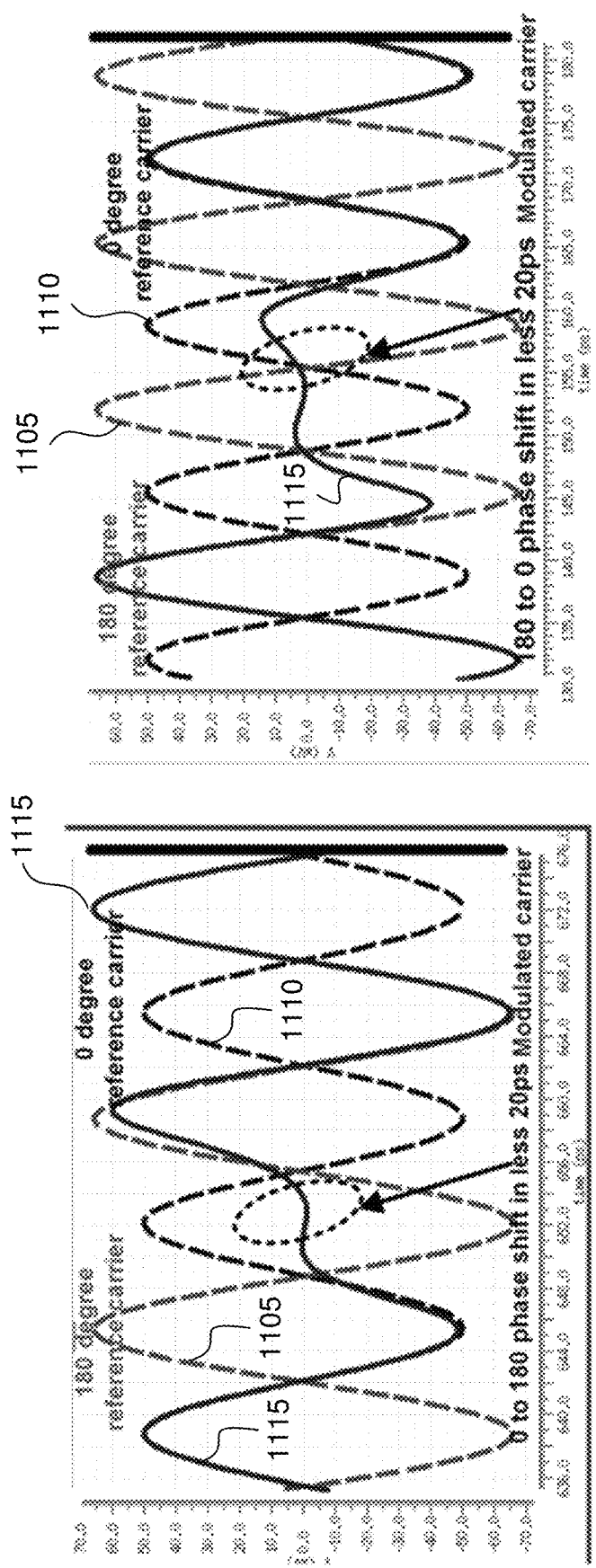
FIGS. 11A-11B illustrate settling time results according to exemplary aspects of the present disclosure.

FIGS. 11A-11B show the transient behavior of the phase modulator 700 for 0 to 180 degree phase shift. As shown, the phase change happens within less than 1 cycle of the waveform of 72 GHz carrier frequency, which is <20 ps. In these plots, the 180 degree reference carrier is shown by line 1105, the 0 degree reference carrier is shown by line 1110, and the modulated carrier is shown by line 1115.

Again, because of the differential nature of the phase modulator 700, glitches produced from switches appear in common mode and are negligible as shown in FIG. 12.

Figure 13B:
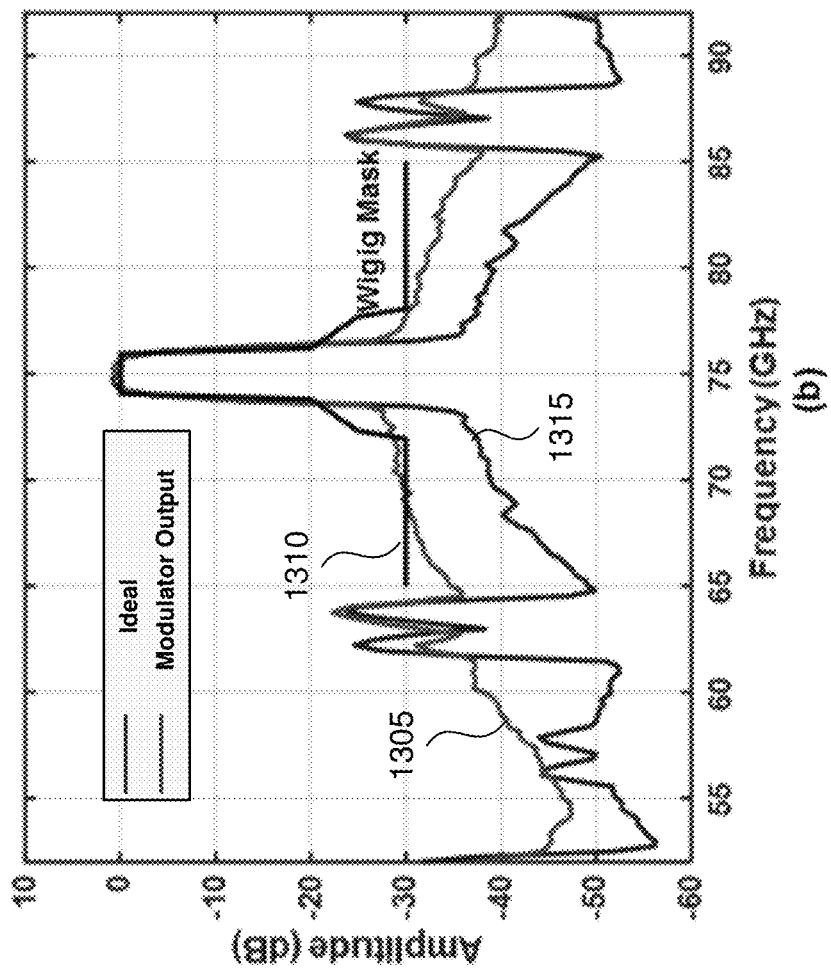
FIGS. 13A-13B illustrate a signal reconstruction and spectral analysis according to exemplary aspects of the present disclosure.
Figure 13A:
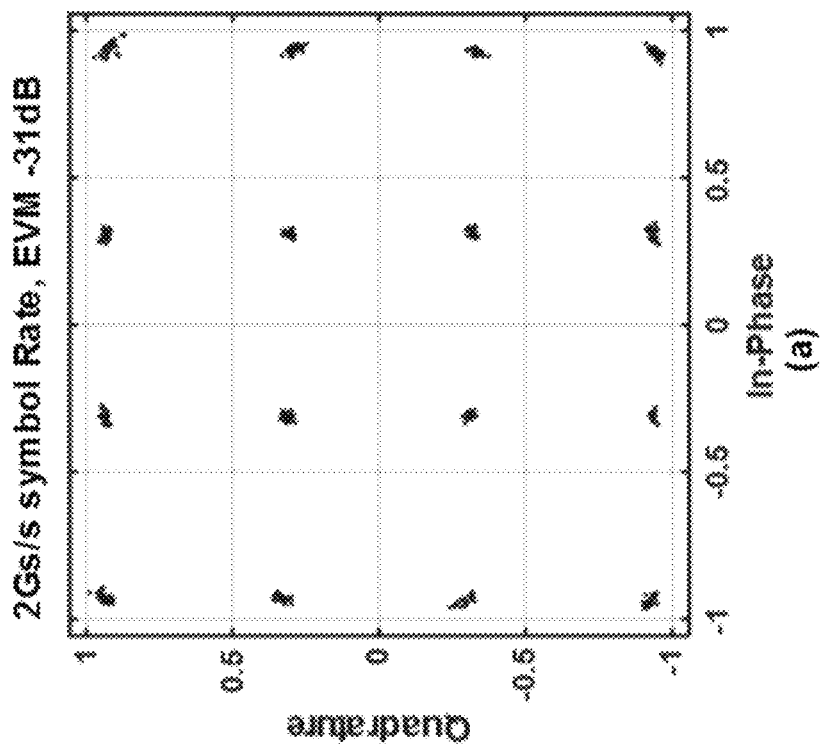

The performance of the phase modulator 700 is illustrated in FIGS. 13A-13B. FIG. 13A illustrates a constellation of 16QAM signal reconstructed in at 2 GS/s symbol rate (and 6× oversampling ratio), while FIG. 13B shows a spectral mask for WiGig (IEEE 802.11ad). In this example, the phase modulator exhibits better than −31 dB and 2.7% EVM while meeting the spectral mask for WiGig (IEEE 802.11ad) without any PVT calibrations.

Figure 14:
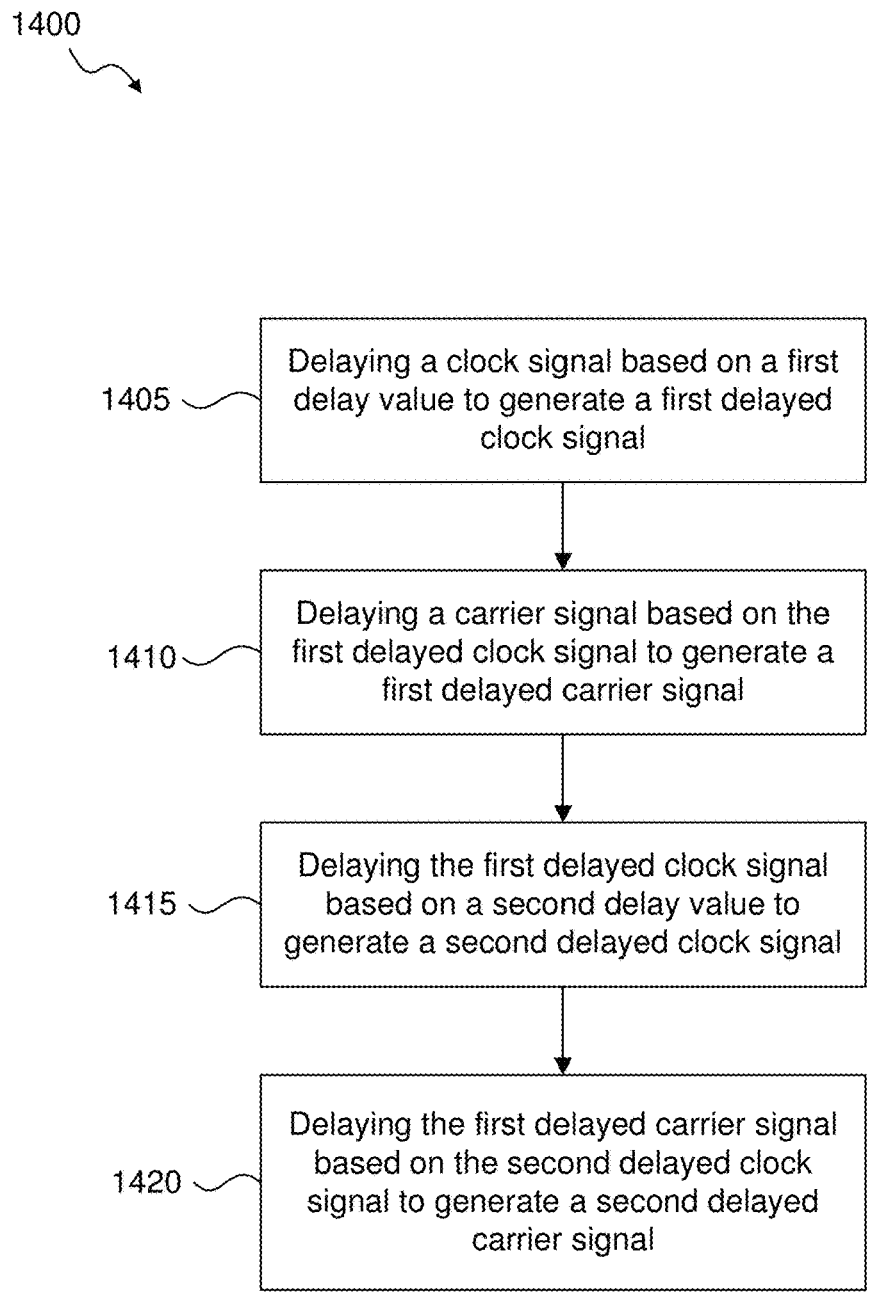
FIG. 14 illustrates a flowchart of a phase modulation method according to exemplary aspects of the present disclosure.

FIG. 14 illustrates a flowchart 1400 of a phase modulation method according to an exemplary aspect of the present disclosure. The flowchart 1400 is described with continued reference to FIGS. 1-13B. The operations of the methods are not limited to the order described below, and the various operations may be performed in a different order. Further, two or more operations of the methods may be performed simultaneously with each other. In an exemplary aspect, the mobile device 400 is configured to perform the method of flowchart 1400.

The method of flowchart 1400 begins at operation 1405, where a clock signal is delayed based on a first delay value to generate a first delayed clock signal. For example, the delay cell 415.1 delays the clock signal to generate an enable signal to enable the flip-flop 420.1.

After operation 1405, the flowchart 1400 transitions to operation 1410, where a carrier signal is delayed based on the first delayed clock signal to generate a first delayed carrier signal. For example, the delay cell 410.1 delays the carrier signal based on the digital bit value ($b_1$) passed by the flip-flop 420.1 in response to the enable signal.

After operation 1410, the flowchart 1400 transitions to operation 1415, where the first delayed clock signal is delayed based on a second delay value to generate a second delayed clock signal. For example, the delay cell 415.2 delays the delayed clock signal delayed by the delay cell 415.1 to generate an enable signal to enable the flip-flop 420.2.

After operation 1415, the flowchart 1400 transitions to operation 1420, where the first delayed carrier signal is delayed based on the second delayed clock signal to generate a second delayed carrier signal. For example, the delay cell 410.2 delays the delayed carrier signal delayed by the delay cell 410.1 based on the digital bit value ($b_2$) passed by the flip-flop 420.2 in response to the enable signal generated by the delay cell 415.2. In this example, the generation of the enable signal by the delay cell 415.2 is delayed by a cumulative delay (e.g. delay caused by delay cell 415.1+ delay caused by delay cell 415.2).

Figure 15:
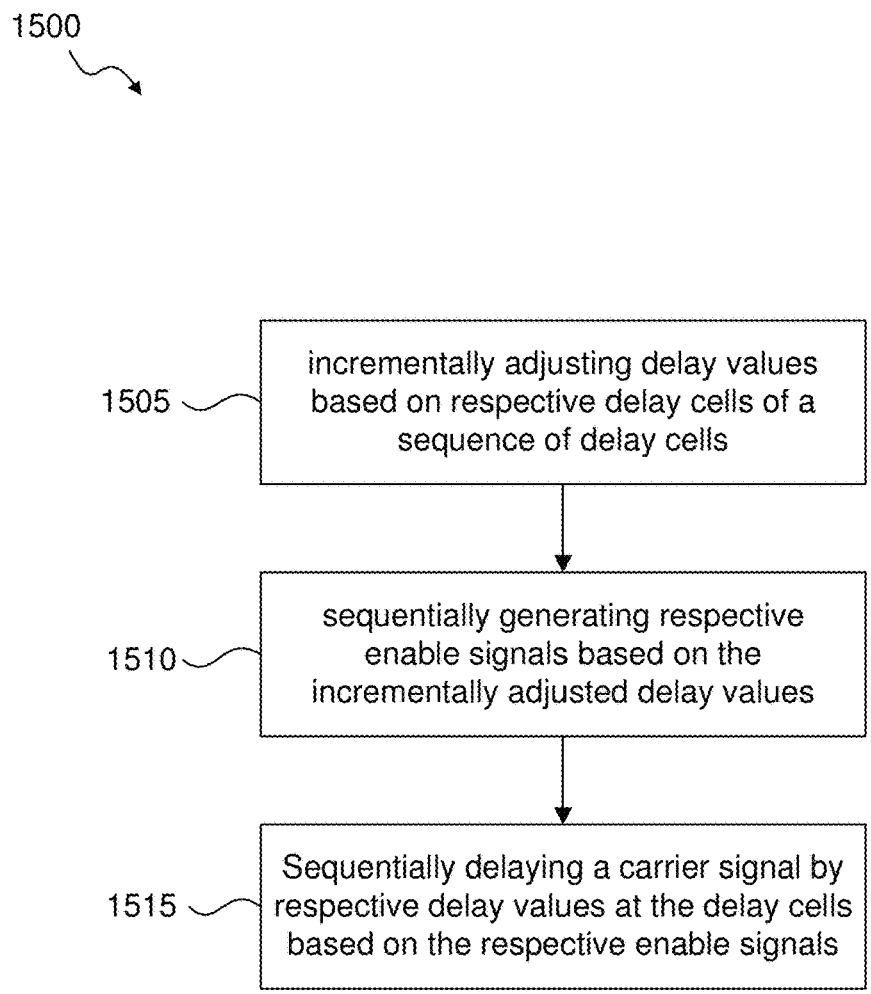
FIG. 15 illustrates a flowchart of a phase modulation method according to exemplary aspects of the present disclosure.

FIG. 15 illustrates a flowchart 1500 of a phase modulation method according to an exemplary aspect of the present disclosure. The flowchart 1500 is described with continued reference to FIGS. 1-13B. The operations of the methods are not limited to the order described below, and the various operations may be performed in a different order. Further, two or more operations of the methods may be performed simultaneously with each other. In an exemplary aspect, the mobile device 400 is configured to perform the method of flowchart 1500.

The method of flowchart 1500 begins at operation 1505, where delay values are incrementally adjusting (e.g. increased) based on respective delay cells of a sequence of delay cells. For example, the delay cells 415.1 to 415.K delay the clock signal. Because the delay cells 415.1 to 415.K are connected in series, the delay of the clock signal is incrementally increased by each subsequent delay cell 415. For example, the clock signal is delayed by an increasing delay that increases by to at each delay cell 415.

After operation 1505, the flowchart 1500 transitions to operation 1510, where respective enable signals are sequentially generated based on the incrementally adjusted delay values. For example, the incrementally increasing delayed clock signal generates respective enable signals for the respective flip-flops 420.1 to 420.K. In this example, the enable signals at the delay circuits 430.1, 430.2, . . . 430.K are generated at times $t_0$, $2t_0$, . . . $Kt_0$.

After operation 1510, the flowchart 1500 transitions to operation 1515, where a carrier signal is sequentially delaying by respective delay values at the delay cells based on the respective enable signals. For example, the respective enable signals control the respective flip-flops 420.1 to 420.K to pass their respective bits $b_1$, $b_2$, . . . $b_K$. The bits then adjust the delay cells 410.1 to 410.K to delay the signal carrier. Because the flip-flops 420.1 to 420.K pass their respective bits $b_1$, $b_2$, . . . $b_K$ sequentially based on the sequentially generated enable signals, the carrier signal is delayed by the respective delay cells 410.1, 410.2, . . . 410.K at times $t_0$, $2t_0$, . . . $Kt_0$. That is, the carrier signal is not delayed simultaneously by the respective delay circuits 430, but rather is delayed sequentially.

EXAMPLES

Example 1 is a phase modulation method, comprising: sequentially generating enable signals based on a clock signal to generate a sequence of enable signals; and delaying a signal by delay values generated from delay cells based on the sequence of enable signals and digital bit values.

Example 2 is the subject matter of Example 1, wherein the enable signals of the sequence of enable signals and the digitally bit values respectively correspond to the delay cells.

Example 3 is the subject matter of any of Examples 1-2, wherein the sequentially generating the enable signals comprises delaying the clock signal at the delay cells based on an incrementally adjusted delay value.

Example 4 is the subject matter of Example 3, wherein the incrementingly adjusted delay value is incrementally increased at each of the delay cells.

Example 5 is the subject matter of Example 4, wherein the delay cells are sequentially arranged to form a sequence of delay cells.

Example 6 is the subject matter of Example 5, wherein the sequence of enable signals respectively correspond to the sequence of delay cells.

Example 7 is the subject matter of any of Examples 1-6, wherein delay cells are sequentially arranged to form a sequence of delay cells that respectively generate the delay values, wherein the delay values incrementally increase at each delay cell in the sequence of delay cells.

Example 8 is the subject matter of Example 7, wherein the sequence of delay cells form an artificial transmission line.

Example 9 is a phase modulator comprising: a first delay circuit configured to: delay a clock signal based on a first delay value to generate a first delayed clock signal; and delay a carrier signal based on the first delayed clock signal to generate a first delayed carrier signal; and a second delay circuit configured to: delay the first delayed clock signal based on a second delay value to generate a second delayed clock signal; and delay the first delayed carrier signal based on the second delayed clock signal to generate a second delayed carrier signal.

Example 10 is the subject matter of Example 9, wherein the second delayed carrier signal is delayed by a sum of the first delay value and the second delay value.

Example 11 is the subject matter of any of Examples 9-10, wherein the first delay value and the second delay value are equal.

Example 12 is the subject matter of any of Examples 9-11, wherein the first delay circuit comprises: a first delay cell configured to delay the clock signal to generate the first delayed clock signal; a first memory configured to provide a first bit value based on the first delayed clock signal; and a second delay cell configured to delay the carrier signal based on the first bit value.

Example 13 is the subject matter of Example 12, wherein the first memory is a flip-flop configured to pass the first bit value based on the first delayed clock signal.

Example 14 is the subject matter of any of Examples 9-13, wherein the second delay circuit comprises: a third delay cell configured to delay the first delayed clock signal to generate the second delayed clock signal; a second memory configured to provide a second bit value based on the second delayed clock signal; and a fourth delay cell configured to delay the first delayed carrier signal based on the second bit value.

Example 15 is the subject matter of Example 14, wherein the second memory is a flip-flop configured to pass the second bit value based on the second delayed clock signal.

Example 16 is the subject matter of any of Examples 9-15, wherein the first and the second delay circuits form an artificial transmission line.

Example 17 is a wireless communication device comprising the phase modulator of and of Examples 9-16.

Example 18 is a delay circuit comprising: a first delay cell configured to delay a clock signal to generate a delayed clock signal; a memory configured to provide a bit value based on the delayed clock signal; and a second delay cell configured to delay a signal based on the delayed signal.

Example 19 is the subject matter of Example 18, wherein the memory is a flip-flop configured to pass the bit value based on the delayed clock signal, wherein the delayed clock signal is configured as an enable signal for the flip-flop.

Example 20 is a phase modulator comprising the delay circuit of any of Examples 18-19.

Example 21 is a phase modulator comprising two or more delay circuits of any of Examples 18-19.

Example 22 is the phase modulator of Example 21, wherein the two or more delay circuits are configured to cooperatively and sequentially delay the signal.

Example 23 is the subject matter of any of Examples 21-22, wherein the two or more delay circuits are configured as an artificial transmission line.

Example 24 is the subject matter of any of Examples 18-20, wherein the delay circuit is configured as an artificial transmission line.

Example 25 is a phase modulator comprising: a first delay means for: delaying a clock signal based on a first delay value to generate a first delayed clock signal; and delaying a carrier signal based on the first delayed clock signal to generate a first delayed carrier signal; and a second delay means for: delaying the first delayed clock signal based on a second delay value to generate a second delayed clock signal; and delaying the first delayed carrier signal based on the second delayed clock signal to generate a second delayed carrier signal.

Example 26 is the subject matter of Example 25, wherein the second delayed carrier signal is delayed by a sum of the first delay value and the second delay value.

Example 27 is the subject matter of any of Examples 25-26, wherein the first delay value and the second delay value are equal.

Example 28 is the subject matter of any of Examples 25-27, wherein the first delay means comprises: a first delay cell configured to delay the clock signal to generate the first delayed clock signal; a first memory configured to provide a first bit value based on the first delayed clock signal; and a second delay cell configured to delay the carrier signal based on the first bit value.

Example 29 is the subject matter of Example 28, wherein the first memory is a flip-flop configured to pass the first bit value based on the first delayed clock signal.

Example 30 is the subject matter of any of Examples 25-29, wherein the second delay means comprises: a third delay cell configured to delay the first delayed clock signal to generate the second delayed clock signal; a second memory configured to provide a second bit value based on the second delayed clock signal; and a fourth delay cell configured to delay the first delayed carrier signal based on the second bit value.

Example 31 is the subject matter of Example 30, wherein the second memory is a flip-flop configured to pass the second bit value based on the second delayed clock signal.

Example 32 is the subject matter of any of Examples 25-31, wherein the first and the second delay means form an artificial transmission line.

Example 33 is a wireless communication device comprising the phase modulator of and of Examples 25-32.

Example 34 is a delay circuit comprising: a first delay means for delaying a clock signal to generate a delayed clock signal; a storing means for proving a bit value based on the delayed clock signal; and a second delay means for delay a signal based on the delayed signal.

Example 35 is the subject matter of Example 34, wherein the storing means is a flip-flop configured to pass the bit value based on the delayed clock signal, wherein the delayed clock signal is configured as an enable signal for the flip-flop.

Example 36 is a phase modulator comprising the delay circuit of any of Examples 34-35.

Example 37 is a phase modulator comprising two or more delay circuits of any of

Examples 34-35.

Example 38 is the phase modulator of Example 37, wherein the two or more delay circuits are configured to cooperatively and sequentially delay the signal.

Example 39 is the subject matter of any of Examples 37-38, wherein the two or more delay circuits are configured as an artificial transmission line.

Example 40 is the subject matter of any of Examples 34-36, wherein the delay circuit is configured as an artificial transmission line.

Example 41 is a computer-readable medium comprising program instructions, when executed, causes a processor to perform the method of any of Examples 1-8.

Example 42 is an apparatus substantially as shown and described.

Example 43 is a method substantially as shown and described.

CONCLUSION

The aforementioned description of the specific aspects will so fully reveal the general nature of the disclosure that others can, by applying knowledge within the skill of the art, readily modify and/or adapt for various applications such specific aspects, without undue experimentation, and without departing from the general concept of the present disclosure. Therefore, such adaptations and modifications are intended to be within the meaning and range of equivalents of the disclosed aspects, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

References in the specification to "one aspect," "an aspect," "an exemplary aspect," etc., indicate that the aspect described may include a particular feature, structure, or characteristic, but every aspect may not necessarily include the particular feature, structure, or characteristic. Moreover, such phrases are not necessarily referring to the same aspect. Further, when a particular feature, structure, or characteristic is described in connection with an aspect, it is submitted that it is within the knowledge of one skilled in the art to affect such feature, structure, or characteristic in connection with other aspects whether or not explicitly described.

The exemplary aspects described herein are provided for illustrative purposes, and are not limiting. Other exemplary aspects are possible, and modifications may be made to the exemplary aspects. Therefore, the specification is not meant to limit the disclosure. Rather, the scope of the disclosure is defined only in accordance with the following claims and their equivalents.

Aspects may be implemented in hardware (e.g., circuits), firmware, software, or any combination thereof. Aspects may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general purpose computer.

For the purposes of this discussion, the term "processor circuitry" shall be understood to be circuit(s), processor(s), logic, or a combination thereof. For example, a circuit includes an analog circuit, a digital circuit, state machine logic, other structural electronic hardware, or a combination thereof. A processor includes a microprocessor, a digital signal processor (DSP), central processing unit (CPU), application-specific instruction set processor (ASIP), graphics and/or image processor, multi-core processor, or other hardware processor. The processor can be "hard-coded" with instructions to perform corresponding function(s) according to aspects described herein. Alternatively, the processor can access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary aspects described herein, processor circuitry can include memory that stores data and/or instructions. The memory can be any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

As will be apparent to a person of ordinary skill in the art based on the teachings herein, exemplary aspects are not limited to communication protocols that utilize the millimeter wave (mmWave) spectrum (e.g., 24 GHz-300 GHz), such as WiGig (IEEE 802.11ad and/or IEEE 802.11ay) which operates at 60 GHz, and/or one or more 5G protocols using, for example, the 28 GHz frequency spectrum. The exemplary aspects can be applied to other wireless communication protocols/standards (e.g., LTE or other cellular protocols, other IEEE 802.11 protocols, etc.) as would be understood by one of ordinary skill in the relevant arts.

What is claimed is:

1. A phase modulation method, comprising:
   sequentially generating enable signals based on a clock signal to generate a sequence of enable signals; and
   delaying a signal by delay values generated from delay cells based on the sequence of enable signals and digital bit values.

2. The method of claim 1, wherein the enable signals of the sequence of enable signals and the digital bit values respectively correspond to the delay cells.

3. The method of claim 1, wherein the sequentially generating the enable signals comprises delaying the clock signal at the delay cells based on an incrementally adjusted delay value.

4. The method of claim 3, wherein the incrementingly adjusted delay value is incrementally increased at each of the delay cells.

5. The method of claim 4, wherein the delay cells are sequentially arranged to form a sequence of delay cells.

6. The method of claim 5, wherein the sequence of enable signals respectively correspond to the sequence of delay cells.

7. The method of claim 1, wherein delay cells are sequentially arranged to form a sequence of delay cells that respectively generate the delay values, wherein the delay values incrementally increase at each delay cell in the sequence of delay cells.

8. The method of claim 7, wherein the sequence of delay cells form an artificial transmission line.

9. A computer-readable medium comprising program instructions, when executed, causes a processor to perform the method of claim 1.

10. A phase modulator comprising:
a first delay circuit configured to:
    delay a clock signal based on a first delay value to generate a first delayed clock signal; and
    delay a carrier signal based on the first delayed clock signal to generate a first delayed carrier signal; and
a second delay circuit configured to:
    delay the first delayed clock signal based on a second delay value to generate a second delayed clock signal; and
    delay the first delayed carrier signal based on the second delayed clock signal to generate a second delayed carrier signal.

11. The phase modulator of claim 10, wherein the second delayed carrier signal is delayed by a sum of the first delay value and the second delay value.

12. The phase modulator of claim 10, wherein the first delay value and the second delay value are equal.

13. The phase modulator of claim 10, wherein the first delay circuit comprises:
a first delay cell configured to delay the clock signal to generate the first delayed clock signal;
a first memory configured to provide a first bit value based on the first delayed clock signal; and
a second delay cell configured to delay the carrier signal based on the first bit value.

14. The phase modulator of claim 13, wherein the first memory is a flip-flop configured to pass the first bit value based on the first delayed clock signal.

15. The phase modulator of claim 14, wherein the first delayed clock signal is configured as an enable signal for the flip-flop.

16. The phase modulator of claim 10, wherein the second delay circuit comprises:
a third delay cell configured to delay the first delayed clock signal to generate the second delayed clock signal;
a second memory configured to provide a second bit value based on the second delayed clock signal; and
a fourth delay cell configured to delay the first delayed carrier signal based on the second bit value.

17. The phase modulator of claim 16, wherein the second memory is a flip-flop configured to pass the second bit value based on the second delayed clock signal.

18. The phase modulator of claim 17, wherein the second delayed clock signal is configured as an enable signal for the flip-flop.

19. The phase modulator of claim 10, wherein the first and the second delay circuits form an artificial transmission line.

20. A wireless communication device comprising the phase modulator of claim 10.

* * * * *